(12) United States Patent
Ishida

(10) Patent No.: US 7,915,633 B2
(45) Date of Patent: Mar. 29, 2011

(54) NITRIDE SEMICONDUCTOR DEVICE AND MANUFACTURING METHOD THEREOF

(75) Inventor: Masahiro Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 253 days.

(21) Appl. No.: 12/265,161

(22) Filed: Nov. 5, 2008

(65) Prior Publication Data

US 2009/0134428 A1    May 28, 2009

(30) Foreign Application Priority Data

Nov. 28, 2007    (JP) .................. 2007-306929

(51) Int. Cl.
   *H01L 33/00*    (2010.01)
(52) U.S. Cl. ............... 257/102; 257/103; 257/E33.033; 257/E33.034
(58) Field of Classification Search .............. 257/102, 257/103, E33.033, E33.034
   See application file for complete search history.

(56) References Cited

U.S. PATENT DOCUMENTS

| 5,306,662 | A | 4/1994 | Nakamura et al. |
| 6,066,868 | A | 5/2000 | Evans, Jr. |
| 6,207,469 | B1 | 3/2001 | Ota et al. |
| 6,455,877 | B1 | 9/2002 | Ogawa et al. |
| 2002/0004254 | A1 | 1/2002 | Miki et al. |
| 2006/0011946 | A1 | 1/2006 | Toda et al. |

FOREIGN PATENT DOCUMENTS

| JP | 05-183189 A | 7/1993 |
| JP | 11-126758 A | 5/1999 |
| JP | 2001-148357 A | 5/2001 |

*Primary Examiner* — Minh-Loan T Tran
(74) *Attorney, Agent, or Firm* — McDermott Will & Emery LLP

(57) ABSTRACT

A nitride semiconductor device includes: a semiconductor substrate; a p-type semiconductor layer formed over the semiconductor substrate, made of a nitride semiconductor, and containing first impurities; and an insulating film contacting the p-type semiconductor layer and having an impurity region containing second impurities for trapping hydrogen. Since residual hydrogen in the p-type semiconductor layer is trapped in the impurity region, the hydrogen concentration in the impurity region is higher than that in the insulating film excluding the impurity region.

15 Claims, 10 Drawing Sheets

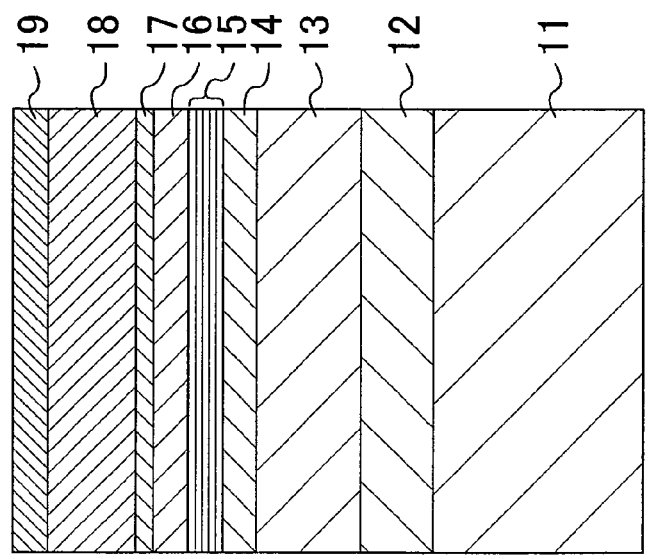
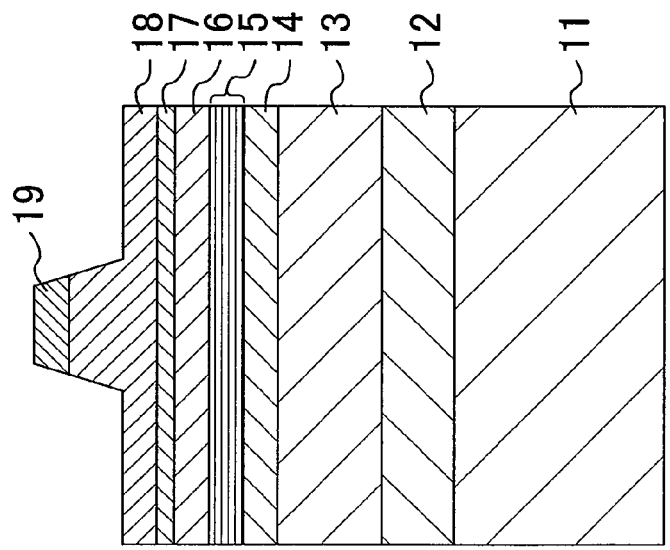
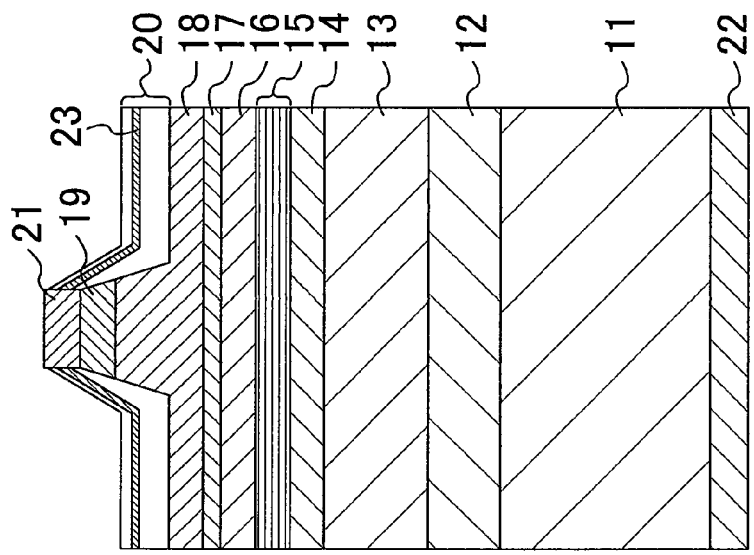

FIG.3

BOND ENTHALPY WITH HYDROGEN ATOMS (kJ/mol)

| | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| | H 435.99 | | | | | | | | | | | | | | | | | He |
| | Li 238.05 | Be 200 | | | | | | | | | | | B 340 | C 338.4 | N 339 | O 427.6 | F 569.87 | Ne |
| | Na 185.69 | Mg 126.4 | | | | | | | | | | | Al 284.9 | Si 299.2 | P 297 | S 344.3 | Cl 431.62 | Ar |
| | K 174.58 | Ca 167.8 | Sc 180 | Ti 204.6 | V 208.7 | Cr 190.3 | Mn 234 | Fe 180 | Co 226 | Ni 252.3 | Cu 277.8 | Zn 85.8 | Ga 274.1 | Ge 321.7 | As 274 | Se 314.47 | Br 366.35 | Kr |
| | Rb 167 | Sr 163 | Y | Zr | Nb | Mo | Tc | Ru 234 | Rh 247 | Pd 234 | Ag 215.1 | Cd 69 | In 243.1 | Sn 264 | Sb | Te 268 | I 298.41 | Xe |
| | Cs 175.36 | Ba 176 | La | Hf | Ta | W | Re | Os | Ir | Pt 335 | Au 292 | Hg 39.844 | Tl 188 | Pb 157 | Bi 283.3 | Po | At | Rn |

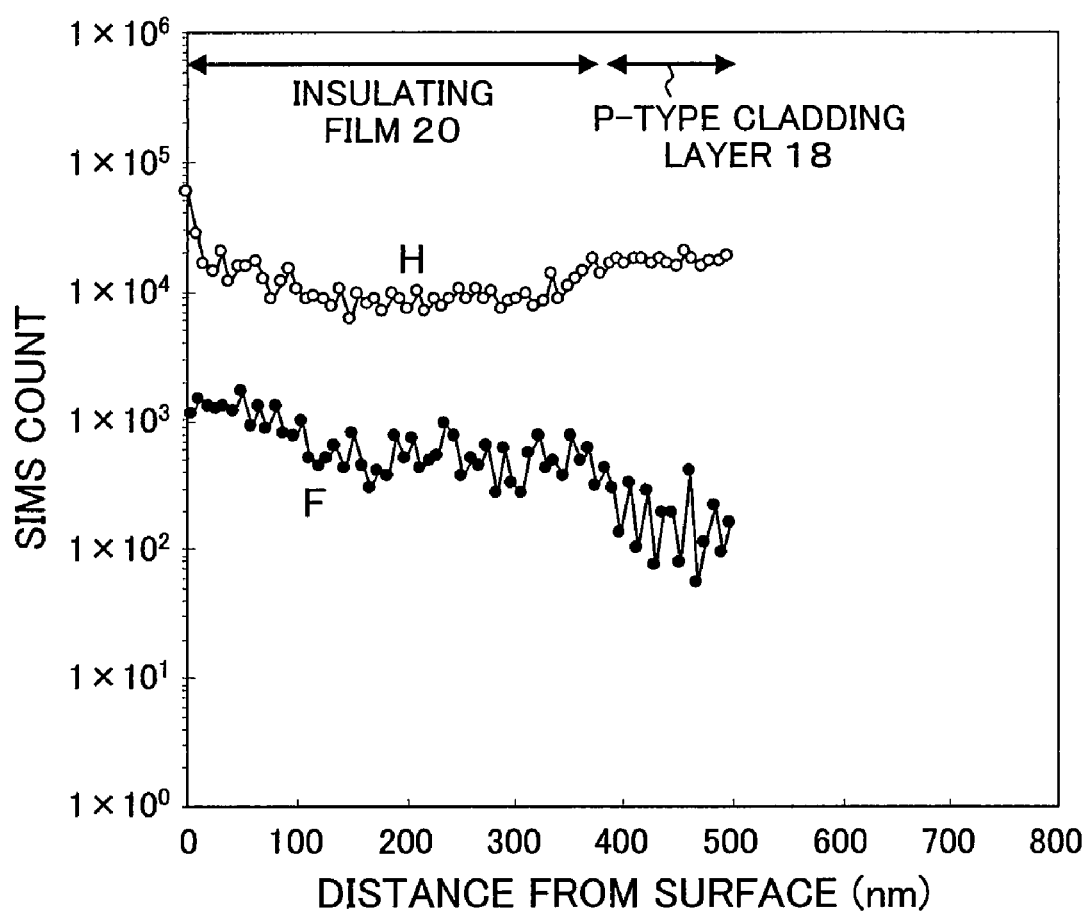

NITRIDE SEMICONDUCTOR DEVICE AND MANUFACTURING METHOD THEREOF

CROSS REFERENCE TO RELATED APPLICATION

This application claims priority under 35 U.S.C. §119(a) on Japanese Patent Application No. 2007-306929 filed on Nov. 28, 2007, the entire contents of which are hereby incorporated by reference.

BACKGROUND OF THE INVENTION

1. Field of the Invention

The present invention relates to a nitride semiconductor device such as a light emitting device like a laser diode (LD) and a light emitting diode (LED), a light receiving device like a photodiode, and an electronic device like a transistor. More particularly, the present invention relates to a nitride semiconductor device having a p-type layer.

2. Related Art

A nitride semiconductor has been used as a material of a light emitting device such as a laser diode and a light emitting diode.

FIG. 11 is a cross-sectional view of a conventional nitride semiconductor functioning as a laser device, which is described in Japanese Laid-Open Patent Publication No. 2001-148357. As shown in FIG. 11, in the conventional semiconductor device, an n-type GaN (gallium nitride) layer 103, an n-type cladding layer 104 made of n-type AlGaN (aluminum gallium nitride), an n-type optical guide layer 105 made of n-type GaN, a multiple quantum well layer 106 made of InGaN (indium gallium nitride), an electron blocking layer 107 made of p-type AlGaN, a p-type optical guide layer 108 made of p-type GaN, a p-type cladding layer 109 made of p-type AlGaN, and a contact layer 110 made of p-type GaN are sequentially formed from bottom to top on a top surface of an n-type GaN substrate 102. An upper part of the p-type cladding layer 109 and the contact layer 110 form a ridge portion. A p-side electrode 111 is formed on the contact layer 110. An n-side electrode 101 is formed on a back surface (N-terminal face 102A) of the n-type GaN substrate 102.

In order to manufacture the conventional semiconductor device, the n-type GaN layer 103, the n-type cladding layer 104, and the n-type optical guide layer 105 are first sequentially grown on the n-type GaN layer 102 by a metalorganic chemical vapor deposition (MOCVD) method at a growth temperature of 1,050° C. by using a hydrogen carrier gas. The multiple quantum well layer 106 is then grown at a substrate temperature of 700° C. by using a nitrogen carrier gas. The electron blocking layer 107, the p-type optical guide layer 108, the p-type cladding layer 109, and the contact layer 110 are then sequentially grown at a substrate temperature of 1,050° C. by using a hydrogen carrier gas.

The p-type cladding layer 109 and the p-type GaN contact layer 110 are then etched into a stripe shape with a width of 5 μm by using a dry etching device, whereby a ridge-type optical waveguide is formed. The p-side electrode 111 is then formed on the contact layer 110, and the n-side electrode 101 is formed on the N-terminal face 102A of the n-type GaN substrate 102. Finally, cleavage is performed so that the ridge-type optical waveguide has a length of 1 mm, and a dielectric material or the like is deposited on the cleaved surface to form a mirror end face. A semiconductor laser is thus completed.

A p-type nitride semiconductor grown by a MOCVD method usually contains hydrogen atoms having approximately the same concentration as an acceptor concentration. Since the hydrogen atoms hinder generation of holes, the p-type layer has a high resistance right after the growth. Therefore, after the p-type layer is grown by the MOCVD method, a process for reducing the resistance of the p-type layer is performed. This process is called an activation process.

Performing an annealing process at 400° C. or higher as described in Japanese Laid-Open Patent Publication No. H05-183189 is known as a p-type layer activation process. Japanese Laid-Open Patent Publication No. H11-126758 also describes a technology of improving a contact resistance between p-type GaN and a metal by facilitating activation of a p-type layer by irradiation of light with energy exceeding a semiconductor bandgap.

SUMMARY OF THE INVENTION

In the above conventional nitride semiconductor device, however, the p-type layer has residual hydrogen on the order of about $10^{17}$ cm$^{-3}$ to about $10^{18}$ cm$^{-3}$ even after the above activation process. Such residual hydrogen reduces the acceptor activation ratio and increases the resistance of the p-type layer and the contact resistance between the p-type layer and the p-side electrode, causing increase in operating voltage. In a semiconductor device having a pn junction such as a semiconductor laser device or an LED, reduction in acceptor activation ratio in a p-type layer increases electron overflow, causing increase in operating current.

Such increase in operating voltage and increase in operating current affect the efficiency and reliability of a nitride semiconductor device, and desired optical output and life cannot be obtained.

The residual hydrogen concentration may be reduced by increasing the activation time and/or the activation temperature. However, such a method produces defects such as nitrogen holes in the active layer or the like and thus reduces the hole concentration in the p-type layer, thereby causing increase in operating voltage and increase in operating current. In other words, it is extremely difficult to completely remove residual hydrogen by the conventional activation processes.

In conventional nitride semiconductor devices, residual hydrogen after an activation process has a significant impact on efficiency and reliability of the semiconductor devices, hindering increase in power and life of nitride semiconductor devices.

In view of the above problems, it is an object of the present invention to provide a high power, long life nitride semiconductor device with reduced residual hydrogen in a p-type nitride semiconductor layer.

In order to achieve the above object, a nitride semiconductor device according to the present invention includes: a semiconductor substrate; a p-type semiconductor layer formed over the semiconductor substrate, made of a nitride semiconductor, and containing first impurities; and an insulating film contacting the p-type semiconductor layer and having an impurity region containing second impurities for trapping hydrogen.

In the above structure, the second impurities in the impurity region trap hydrogen contained in the p-type semiconductor layer. Hydrogen that is included during formation of the p-type semiconductor layer can thus be moved to the impurity region, whereby reduction in acceptor activation ratio in the p-type semiconductor layer can be effectively suppressed. Therefore, increase in operating voltage and increase in operating current can be suppressed, and higher power, longer life can be implemented. Note that, since the impurity region traps hydrogen, the impurity region contains hydrogen at a higher concentration than that of the other region.

Preferably, the nitride semiconductor device of the present invention is, for example, a semiconductor laser device, an LED, or the like. However, even if the nitride semiconductor device of the present invention is a device other than these, reduction in acceptor activation ratio can be reduced and therefore degradation of the device and the like can be suppressed.

A first method for manufacturing a nitride semiconductor device according to the present invention includes the steps of: (a) sequentially depositing on a top surface of an n-type semiconductor substrate an n-type semiconductor layer made of a nitride semiconductor, an active layer, and a p-type semiconductor layer made of a nitride semiconductor and containing first impurities; and (b) forming on the p-type semiconductor layer a first insulating film having an impurity region containing second impurities for trapping hydrogen.

According to this method, the impurity region for trapping hydrogen is formed in the insulating film that is in contact with the p-type semiconductor layer. Hydrogen that is included during formation of the p-type semiconductor layer can therefore be moved to the impurity region. As a result, hydrogen concentration in the p-type semiconductor layer can be reduced, and reduction in acceptor activation ratio in the p-type semiconductor layer can be prevented. Therefore, reduction in output can be suppressed and the life of the device can be increased. Moreover, hydrogen concentration in the p-type semiconductor layer can be reduced to a lower level as compared to a conventional method, and the p-type semiconductor layer need not be heated to a high temperature. Generation of crystal defects in the active layer and the like can therefore be prevented. Since the hydrogen atoms can be more effectively gettered in the impurity region, a high power, long life nitride semiconductor device can be more reliably obtained.

Note that it is preferable that the second impurities have a higher bond enthalpy with hydrogen atoms than a bond enthalpy of the first impurities with the hydrogen atoms.

A second method for manufacturing a nitride semiconductor device according to the present invention includes the steps of: (a) sequentially depositing on a top surface of an n-type semiconductor substrate an n-type semiconductor layer made of a nitride semiconductor, an active layer, and a p-type semiconductor layer made of a nitride semiconductor and containing first impurities; and (b) forming at least on an end face of the p-type semiconductor layer an insulating film having an impurity region containing second impurities for trapping hydrogen.

By this method as well, the concentration of residual hydrogen in the p-type semiconductor layer can be effectively reduced as in the first manufacturing method of a nitride semiconductor device.

BRIEF DESCRIPTION OF THE DRAWINGS

FIGS. 2A, 2B, and 2C are cross-sectional views illustrating a manufacturing method of a semiconductor laser device according to the first embodiment;

FIG. 3 is a diagram showing a hydrogen bond enthalpy of each element;

FIG. 13 is a graph showing depth distribution of fluorine concentration and hydrogen concentration in a p-type cladding layer and an impurity region in an A1-A2 cross section of the comparative semiconductor laser device.

DETAILED DESCRIPTION OF THE PREFERRED EMBODIMENTS

First Embodiment

Hereinafter, a nitride semiconductor device according to a first embodiment of the present invention will be described with reference to the accompanying drawings.

Figure 1:
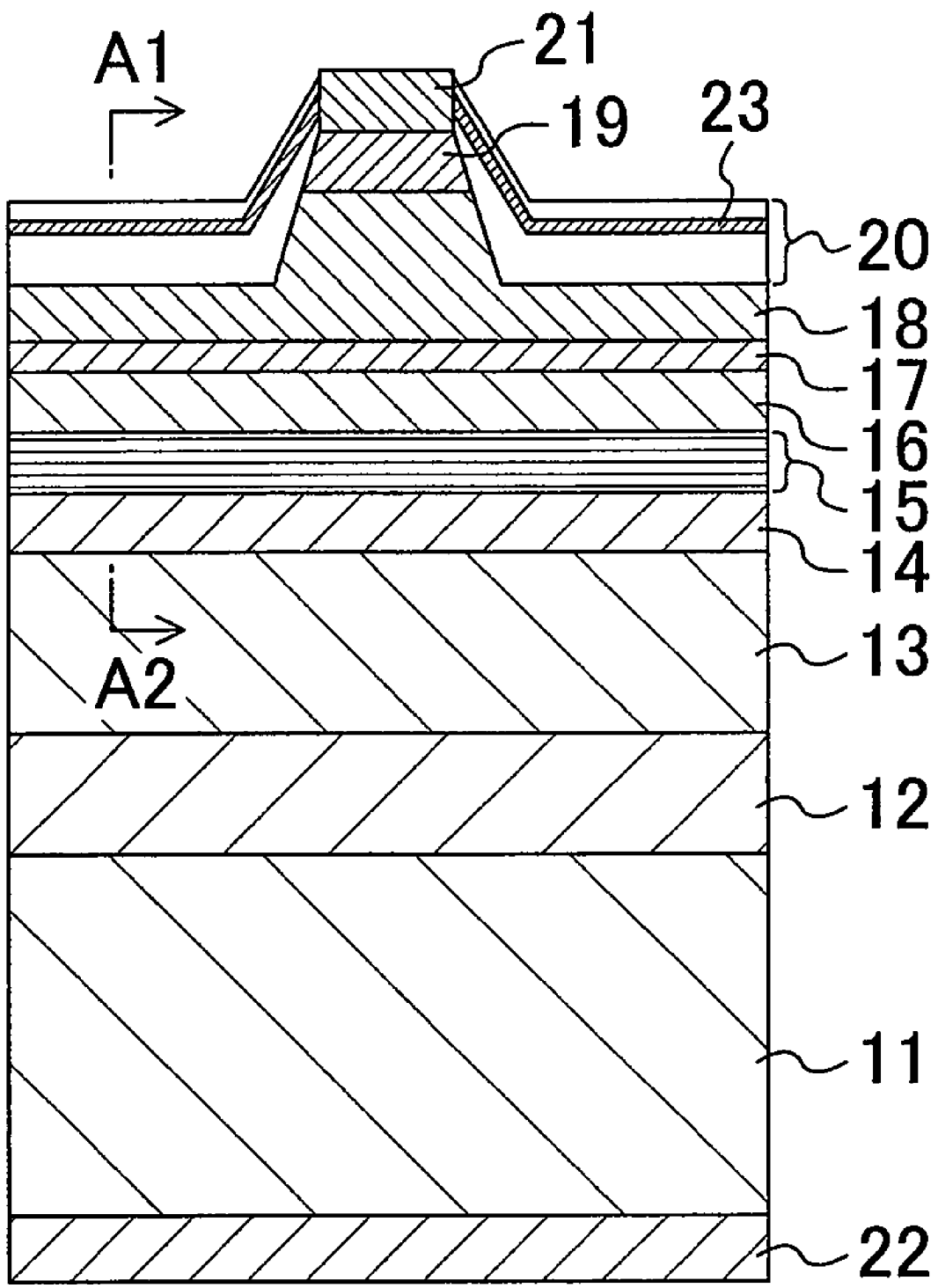
FIG. 1 is a diagram showing a cross-sectional structure of a semiconductor laser device (nitride semiconductor device) according to a first embodiment of the present invention.

FIG. 1 is a diagram showing a cross-sectional structure of a semiconductor laser device (nitride semiconductor device) according to the first embodiment of the present invention. As shown in FIG. 1, in the semiconductor laser device of the present embodiment, an n-type GaN layer 12, an n-type cladding layer 13 made of n-type AlGaN, an n-type optical guide layer 14 made of n-type GaN, a multiple quantum well active layer 15 made of InGaN, a p-type optical guide layer 16 made of p-type GaN, an electron blocking layer 17 made of p-type AlGaN, a p-type cladding layer 18, and a contact layer 19 made of p-type GaN are sequentially formed from bottom to top on a top surface of an n-type GaN substrate 11. Note that operation as a semiconductor laser device is not affected even when the p-type optical guide layer 16 and the electron blocking layer 17 are switched in position.

An upper part of the p-type cladding layer 18 and the contact layer 19 form a ridge waveguide, and a p-side electrode 21 is formed on the contact layer 19. An insulating film 20 is formed so as to extend on a region lateral to the ridge waveguide on the p-type cladding region 18 and on a side surface of the ridge waveguide. An impurity region 23 is formed in the insulating film 20. An n-side electrode 22 is formed on a back surface (nitrogen (N) face) of the n-type GaN substrate 11. The top surface of the n-type GaN substrate 11 is a (0001) gallium (Ga) face.

The n-type GaN layer 12 has a thickness of 1 μm and a silicon (Si) concentration (n-type dopant concentration) of $1\times10^{18}$ cm$^{-3}$. The n-type cladding layer 13 made of n-type AlGaN has an aluminum (Al) composition ratio (composition ratio of Al atoms) of 5%, a thickness of 1.5 μm, and a Si concentration of $1\times10^{18}$ cm$^{-3}$. The n-type optical guide layer 14 made of n-type GaN has a thickness of 0.1 μm and a Si concentration of $1\times10^{18}$ cm$^{-3}$.

The multiple quantum well active layer 15 made of InGaN is formed by a well layer made of InGaN and having a thickness of 3 nm and a barrier layer made of InGaN with an indium (In) composition ratio of 2% and having a thickness of 7 nm. The In composition ratio in the well layer is adjusted so that the emission wavelength becomes 405 nm. The multiple quantum well active layer 15 has a tripe quantum well structure. Note that no intentional doping is employed in the multiple quantum well active layer 15.

The p-type optical guide layer 16 made of p-type GaN has a thickness of 0.1 μm and has been doped with magnesium (Mg) as p-type impurities. The Mg concentration is gradually reduced toward the multiple quantum well active layer 15. In other words, the Mg concentration is $1\times10^{19}$ cm$^{-3}$ at the interface with the electron blocking layer 17 and is approximately zero at the interface with the multiple quantum well active layer 15.

The electron blocking layer 17 made of p-type AlGaN has a thickness of 10 nm and an Al composition ratio of 20%. The Mg concentration (p-type dopant concentration) in the electron blocking layer 17 is $1\times10^{19}$ cm$^{-3}$.

The p-type cladding layer 18 has a superlattice structure formed by a plurality of AlGaN layers each having a thickness of 2 nm and an Al composition ratio of 10% and a plurality of GaN layers each having a thickness of 2 nm. The p-type cladding layer 18 has been doped with Mg at a concentration of $1\times10^{19}$ cm$^{-3}$. The p-type cladding layer 18 has a thickness of 500 nm in a ridge waveguide formation region described below and has a thickness of 100 nm in a region lateral to the ridge waveguide.

The contact layer 19 made of p-type GaN has a thickness of 20 nm and has been doped with Mg at a concentration of $1\times10^{20}$ cm$^{-3}$.

An upper part of the p-type cladding layer 18 and the contact layer 19 form a stripe-shaped ridge waveguide having a <1-100> zone axis. For convenience, the negative sign "−" attached to an index in the zone axis represents inversion of the index following the negative sign. The ridge waveguide limits a current to flow only in a region under the ridge waveguide, thereby performing current confinement. In addition, since an effective refractive index of light is larger in the ridge waveguide formation region than in a non-ridge waveguide formation region, generated light is confined in the ridge waveguide. Note that the ridge waveguide has a width of 1.4 μm at the bottom and has a width of 1.2 μm at the top.

The insulating film 20 has a thickness of 400 nm and is made of silicon oxide or the like. The insulting film 20 serves to protect the p-type cladding layer 18 and the contact layer 19 from contact with the outside.

The p-side electrode 21 in contact with the contact layer 19 is made of, for example, palladium (Pd). The n-side electrode 22 formed on the N terminal face, the back surface of the n-type GaN substrate 11, is made of, for example, titanium (Ti).

The ridge waveguide is cleaved so that the cavity length is 600 μm. The end face of the ridge waveguide forms a (1-100) mirror face (not shown). Note that an insulating film for adjusting a reflectance may be formed on the mirror face.

The semiconductor laser device of the present embodiment is characterized in that the impurity region 23 containing hydrogen-trapping impurities is formed in the insulating film 20. The impurity region 23 has a thickness of about 50 nm and is formed so that the center of the impurity region 23 in the vertical direction in the figure is located at a depth of 100 nm from the top surface of the insulating film 20 in an A1-A2 cross section (see FIG. 1) in a region where the insulating film 20 is approximately flat.

The semiconductor laser device of the present embodiment is manufactured as follows: FIGS. 2A through 2C are cross-sectional views showing a manufacturing method of the semiconductor laser device according to the first embodiment.

First, as shown in FIG. 2A, an n-type GaN layer 12, an n-type cladding layer 13, an n-type optical guide layer 14, a multiple quantum well active layer 15, a p-type optical guide layer 16, an electron blocking layer 17, a p-type cladding layer 18, and a contact layer 19 are sequentially epitaxially grown from bottom to top on a main surface of an n-type GaN substrate by a MOCVD method or the like.

Next, as shown in FIG. 2B, the contact layer 19 and an upper part of the p-type cladding layer 18 are partially removed to form a stripe-shaped ridge waveguide by, for example, a dry etching method using a resist.

As shown in FIG. 2C, a SiO$_2$ (silicon oxide) film having a thickness of 300 nm is then deposited by a thermal CVD method or the like, and the surface of the SiO$_2$ film is processed for about five seconds with CF$_4$ (carbon fluoride) plasma. Plasma irradiation can be performed by using, for example, a parallel flat plate type reactive ion etching (RIE) apparatus and normal SiO$_2$ etching conditions. As a result, fluorine adheres to the surface of the SiO$_2$ film. A SiO$_2$ film having a thickness of 100 nm is then deposited by a thermal CVD method. Since the substrate is heated to 250° C. by the thermal CVD, fluorine adhering to the surface of the 300 nm-thick SiO$_2$ film diffuses to form an impurity region 23 having a thickness of 50 nm. In this step, fluorine contained in the impurity region 23 traps hydrogen contained in the p-type cladding layer 18. This prevents reduction in acceptor activation ratio, whereby a high power, long life semiconductor laser device can be implemented.

Note that, instead of performing plasma irradiation, the substrate may be exposed to a gas atmosphere such as ClF$_3$ (chlorine fluoride) or HF (hydrogen fluoride) at a temperature from room temperature to about 200° C. as a method for making fluorine adhere to the SiO$_2$ film.

In these methods, the concentration and thickness of the impurity region 23 can be adjusted by adjusting the plasma processing time or the gas processing time. A longer processing time is more preferable because the fluorine concentration is increased and more hydrogen can be trapped. However, since fluorine-based plasma or gas etches the SiO$_2$ film, increasing the processing time makes the insulating film 20 thinner than a desired thickness. Moreover, if the processing time is increased, etching becomes dominant rather than adhesion of fluorine. As a result, the adhesion amount of fluorine will be saturated about two minutes after the processing is started. A preferred processing time is therefore between 1 second and two minutes.

Note that, instead of the above methods, the concentration and thickness of the impurity region 23 can be accurately controlled by introducing fluorine by ion implantation after deposition of a SiO$_2$ film having a thickness of 400 nm. When ion implantation is used, no heating process such as thermal CVD may be conducted after introduction of fluorine. Fluorine which is merely introduced by ion implantation or the like may not be activated and hydrogen may be less likely to be trapped. In this case, it is preferable to thermally process the substrate at 150° C. or higher, more preferably, about 250° C., after introduction of fluorine.

Note that impurities that are added to the impurity region 23 are not limited to fluorine. Any material capable of bonding with hydrogen can be used as the impurities. The same atoms as those of p-type impurities or n-type impurities may be used. In order to more effectively trap hydrogen in the impurity region 23, impurities having a higher hydrogen bond enthalpy in absolute value than that of p-type impurities are preferably added to the impurity region 23.

FIG. 3 is a diagram showing a hydrogen bond enthalpy of each element.

In the case of a light emitting device such as a semiconductor laser device, atoms capable of producing sufficiently higher bond energy than light energy and capable of being easily introduced by a process such as ion implantation, diffusion, plasma processing, and wet processing are preferable as impurities of the impurity region 23.

For example, in the case of a semiconductor laser device or LED having an emission wavelength of 405 nm, the energy corresponding to a wavelength of 405 nm is 3.06 eV. A bond enthalpy higher than 295 kJ/mol is required to endure this energy. It can therefore be found from FIG. 3 that atoms that can be used in a light emitting device having an emission wavelength of 405 nm are B (boron), C (carbon), N (nitrogen), O (oxygen), F (fluorine), Si (silicon), P (phosphorus), S (sulfur), Cl (chlorine), Ge (germanium), Se (selenium), Br (bromine), I (iodine), and Pt (platinum).

In the case of a semiconductor laser device having a wavelength of 460 nm, a blue LED, or the like, a bond enthalpy higher than 260 kJ/mol is required. Therefore, Al (aluminum), Cu (copper), Ga (gallium), As (arsenic), Sn (tin), Te (tellurium), and Au (gold) can be used in addition to the atoms listed above.

In the case of a semiconductor laser device having a wavelength of 530 nm, a green LED, or the like, a bond enthalpy higher than 226 kJ/mol is required. Therefore, Li (lithium), Mn (manganese), Co (cobalt), Ni (nickel), Ru (ruthenium), Rh (rhodium), Pd (palladium), and In (indium) can be used in addition to the atoms listed above.

Among the atoms listed above, the most preferable one is fluorine (F) having the highest hydrogen bond enthalpy. Fluorine is therefore used as impurities in the first embodiment.

Introduced atoms may be in the form of a single atom, a cluster formed by several atoms, a fine particle formed by about several tens of atoms or more, or a molecule formed by bonding of atoms. For example, a palladium fine particle formed by several tens of palladium atoms has improved hydrogen adsorption capability over a single palladium atom and may have a higher bond enthalpy than that of a single palladium atom.

Figure 4:
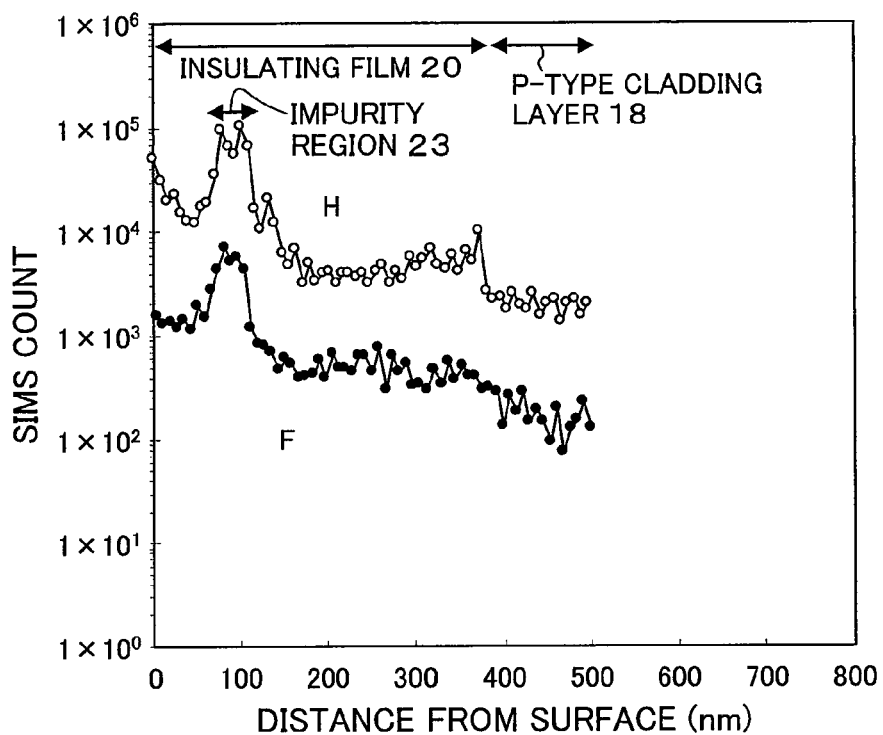
FIG. 4 is a graph showing depth distribution of fluorine concentration and hydrogen concentration in a p-type cladding layer and an impurity region in an A1-A2 cross section of the semiconductor laser device of the first embodiment.

FIG. 4 shows depth distribution of fluorine concentration and hydrogen concentration in the p-type cladding layer and the impurity region in the A1-A2 cross section (see FIG. 1) of the semiconductor laser device of the first embodiment. The fluorine concentration and the hydrogen concentration were evaluated by secondary ion mass spectrometry (SIMS). Note that the insulating film 20 made of $SiO_2$ and the p-type cladding layer 18 having a superlattice including AlGaN layers have different secondary ion generation efficiencies in an SIMS apparatus from each other. Since the SIMS count cannot be converted to a concentration by a single formula from the insulating film 20 to the p-type cladding layer 18, the SIMS count rather than the concentration is shown on the ordinate.

As shown in FIG. 4, the fluorine concentration showed a peak in the impurity region 23. The fluorine concentration was quantified by using samples separately prepared for fluorine quantification in $SiO_2$. As a result, the fluorine concentration was about $2 \times 10^{19}$ $cm^{-3}$. The fluorine concentration in the region other than the peak region was at a background level due to the influence of residual gas or the like in the SIMS measuring apparatus or due to impurities or the like contained in a material or the like other than intentionally doped impurities.

Like the fluorine concentration, the hydrogen concentration distribution also showed a peak in the impurity region 23 and decreased in the remaining region. The hydrogen concentration was quantified by using samples separately prepared for hydrogen quantification in $SiO_2$ and for hydrogen quantification in GaN. As a result, the peak hydrogen concentration in the impurity region 23 was about $2 \times 10^{19}$ $cm^{-3}$. The mean hydrogen concentration in the insulating film 20 other than the impurity region 23 was about $1 \times 10^{18}$ $cm^{-3}$, and the mean hydrogen concentration in the p-type cladding layer 18 was about $3 \times 10^{17}$ $cm^{-3}$. Note that, although the hydrogen concentration seems to gradually increase from the impurity region 23 toward the surface, this is due to the influence of water adhering to the surface of the $SiO_2$ film, or the like. In other words, this was caused in the course of measurement.

Figure 12:
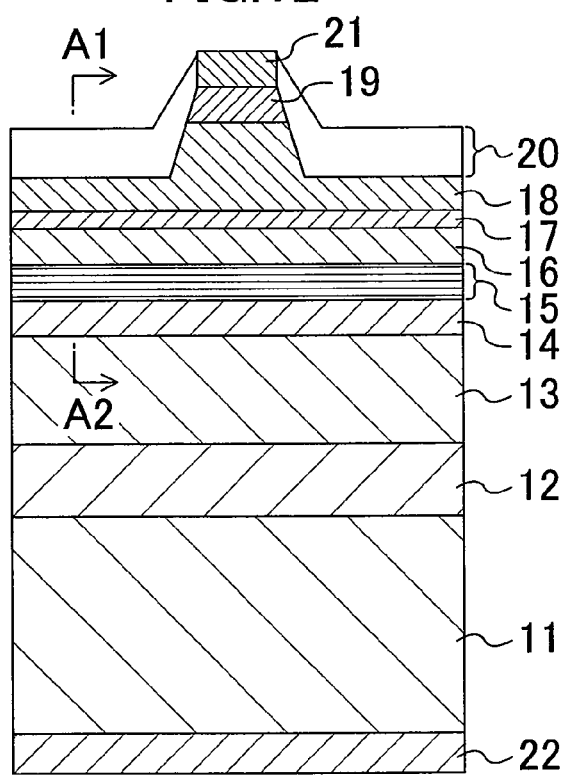
FIG. 12 is a diagram showing a cross-sectional structure of the comparative semiconductor laser device.

FIG. 12 shows a cross-sectional structure of a semiconductor laser device manufactured for comparison with the present invention. The comparative semiconductor laser device shown in FIG. 12 was manufactured for comparison with the semiconductor laser device of the present embodiment regarding operation characteristics and reliability. The comparative semiconductor laser device has exactly the same structure as that of the semiconductor laser device of the present embodiment shown in FIG. 1 except that the comparative semiconductor laser device does not have the impurity region 23. In FIG. 12, each element is denoted by the same reference numeral as that of FIG. 1.

In order to compare the hydrogen concentration in the semiconductor laser device of the first embodiment with that in the comparative semiconductor laser device of FIG. 12, distribution of fluorine concentration and hydrogen concentration was examined also in the comparative semiconductor laser device.

FIG. 13 shows depth distribution of fluorine concentration and hydrogen concentration in the p-type cladding layer and the impurity region in the A1-A2 cross-section (see FIG. 12) of the comparative semiconductor laser device.

The result of FIG. 13 shows that, since the comparative semiconductor laser device does not have the impurity region 23, the hydrogen concentration distribution is at a background level due to the influence of residual gas or the like in the SIMS measuring apparatus or due to impurities or the like contained in a material other than intentionally doped impurities.

As a result of quantifying the hydrogen concentration distribution, the mean hydrogen concentration in the insulating film 20 was about $2 \times 10^{18}$ $cm^{-3}$ and the mean hydrogen concentration in the p-type cladding layer 18 was about $3 \times 10^{18}$ $cm^{-3}$. The result shows that the mean hydrogen concentrations in the insulating film 20 and the p-type cladding layer 18 are both higher than those in the semiconductor laser device of the present embodiment.

Note that, in the semiconductor laser device of the present embodiment, the fluorine concentration and thickness of the impurity region 23 are not limited to the range described above. However, the amount of fluorine to be introduced is preferably determined so that hydrogen in the p-type cladding layer 18 can be sufficiently trapped.

In the case where the p-type cladding layer 18 has a mean hydrogen concentration of about $3 \times 10^{18}$ cm$^{-3}$ and a thickness of 100 nm as in the comparative semiconductor laser device of FIG. 12, it is preferable to determine the amount of fluorine so that at least about $3 \times 10^{11}$ cm$^{-2}$ of hydrogen per unit area can be trapped. For example, it is herein assumed that the fluorine concentration is uniform at $2 \times 10^{19}$ cm$^3$. In this case, it can be calculated that the impurity region 23 having a thickness of 15 nm would be able to trap hydrogen in the p-type cladding layer 18 located right under the impurity region 23. In fact, however, the electron blocking layer 18 and the p-type optical guide layer 16 are of p-type, and hydrogen is present in the electron blocking layer 18 and a part of the p-type optical guide layer 16. Moreover, there are the p-type cladding layer 18 having a thickness of 500 nm and the contact layer 19 in the ridge waveguide. In order to trap hydrogen in these layers, the impurity region 23 preferably has a thickness larger than the above thickness calculated taking only the p-type cladding layer 18 in consideration. Moreover, since an actual fluorine concentration may not have an ideal rectangular shape and may be lower than expected, the impurity region 23 preferably has a larger thickness. In view of the above, the plasma processing time in the present embodiment is adjusted so that the impurity region 23 has a thickness of 50 nm.

In the present invention, the hydrogen concentration in the p-type layer can be significantly reduced by appropriately controlling the amount of hydrogen-trapping impurities according to the concentration of residual hydrogen in the p-type layer.

In a conventional activation process such as thermal annealing or the like, on the other hand, hydrogen atoms in the p-type layer diffuse to the surface by the heat, and two hydrogen atoms meet at the surface to form a hydrogen molecule, whereby hydrogen is thus removed. Therefore, the lower the hydrogen concentration is, the less the probability that two atoms meet becomes. When the hydrogen concentration is about $3 \times 10^{18}$ cm$^{-3}$ or less, the hydrogen concentration is not significantly reduced even if the annealing time is increased.

In the semiconductor laser device of the present embodiment, as can be seen from the comparison between FIGS. 4 and 12, hydrogen is trapped in the impurity region 23 and the hydrogen concentration in the impurity region 23 is higher than that in the region around the impurity region 23. As a result, the hydrogen concentration of the p-type layers including the p-type cladding layer 18 can be significantly reduced as compared to the comparative conventional semiconductor laser device.

Figure 5:
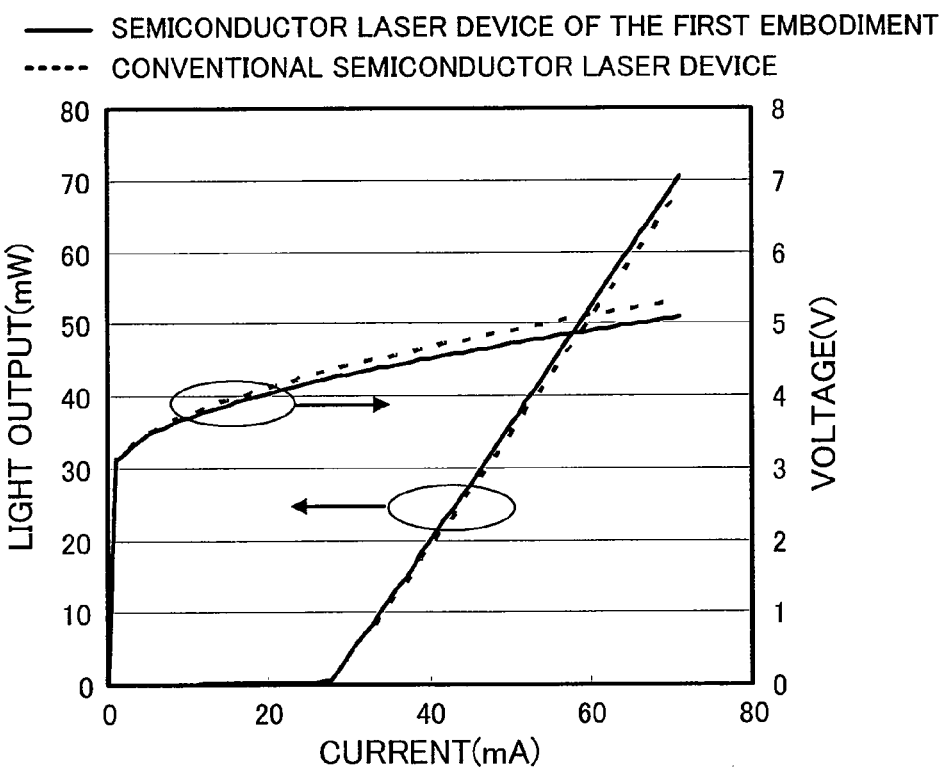
FIG. 5 is a graph showing comparison of a current, optical output, and voltage characteristics between the semiconductor laser device of the first embodiment and a comparative semiconductor laser device.

FIG. 5 is a graph showing comparison of a current, light output, and voltage characteristics between the semiconductor laser device of the first embodiment and the comparative semiconductor laser device.

Since the semiconductor laser device of the present embodiment has the impurity region 23, the hydrogen concentration is reduced also in a current-flowing region of the p-type layer. As a result, the acceptor activation ratio of the p-type layer is improved. Moreover, in the semiconductor laser device of the present embodiment, the impurity region 23 has a sufficiently large thickness. It can therefore be considered that the hydrogen concentration is reduced not only in the A1-A2 cross section but in the ridge region serving as a current path. Therefore, the semiconductor laser device of the first embodiment shown by solid line has a lower resistance than that of the comparative semiconductor laser device shown by broken line. It was thus confirmed that, with the same current value, the semiconductor laser device of the first embodiment could operate with a lower operating voltage than that of the comparative semiconductor laser device.

The semiconductor laser device of the first embodiment is thus characterized in terms of capability in that a lower operating voltage and thus lower power consumption can be implemented as compared to the comparative semiconductor laser device. Therefore, when the semiconductor laser device of the first embodiment is used as, for example, a light source of a DVD (digital versatile disk) device, the breakdown voltage of a laser drive circuit can be reduced as compared to the case where the conventional semiconductor laser device is used. Therefore, size reduction in circuit and cost reduction can be implemented. Moreover, long-time operation can be achieved in a battery-driven portable device due to the low power consumption.

Figure 6:
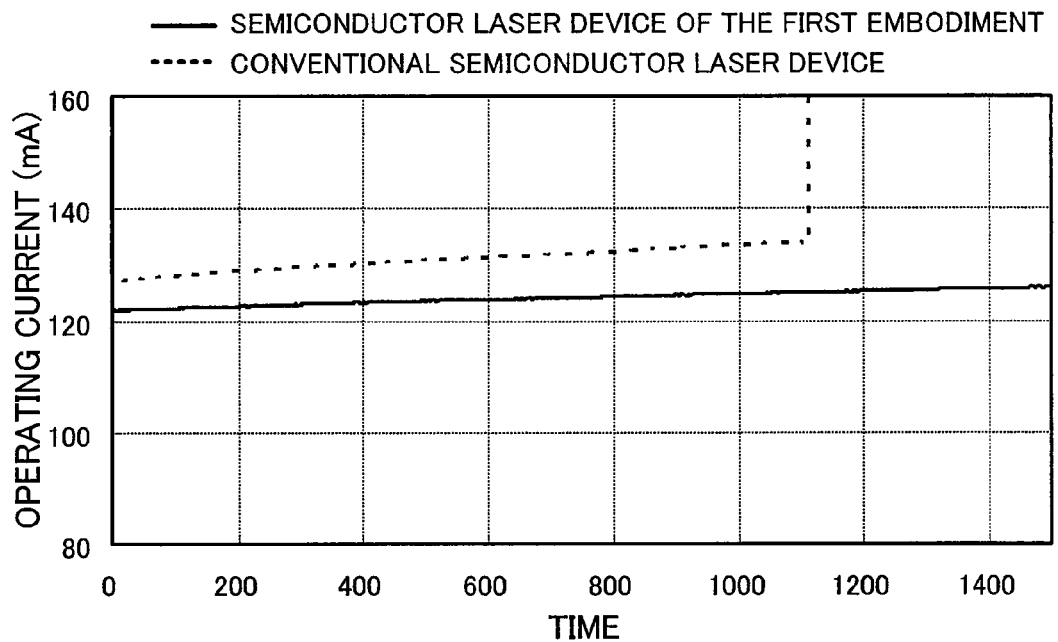
FIG. 6 is a graph showing the result of a high temperature reliability acceleration test performed on the semiconductor laser device of the first embodiment and the comparative semiconductor laser device.

FIG. 6 shows a result of a high temperature reliability acceleration test performed on the semiconductor laser device of the first embodiment and the comparative semiconductor laser device. In this test, change in operating current was measured while keeping the temperature at 80° C. and controlling the amount of injected current so that constant light output of 120 mW was obtained with pulse output having a duty ratio of 50%.

As shown in FIG. 6, in the comparative semiconductor laser device, an operating current gradually increased with time. The comparative semiconductor laser device was broken down with abrupt increase in operating current when the operating time exceeded 1,000 hours. This is a phenomenon that the mirror face 24 is destructively damaged due to light and heat produced by high power operation (COD: Catastrophic Optical Damage).

In the semiconductor laser device of the present embodiment, on the other hand, the energy level in a conduction band of the p-type layer increases due to a high acceptor activation ratio, whereby the amount of band discontinuity in a conduction band between the active layer and the p-type layer is increased. Since electron overflow is reduced, the semiconductor laser device can be operated at a lower operating current to obtain the same light output. Both an operating voltage and an operating current in the early stage of operation are thus suppressed. When the power consumption is low in the early stage of operation, increase in operating current during continuous operation can be suppressed. Degradation can therefore be significantly delayed. As a result, increase in operating current is within several percents even after 1,500 hours, and extremely stable operation can be obtained. The difference between the semiconductor laser device of the present embodiment and the conventional semiconductor laser device is significant under harsh conditions such as a high temperature, high power, and long-time operation.

The semiconductor laser device of the first embodiment can thus operate for a long time under a high temperature environment. Accordingly, when the semiconductor laser device of the first embodiment is applied to, for example, a DVD device, a more reliable, longer life DVD device can be implemented. Moreover, an on-vehicle DVD device that is required to operate at a higher temperature can be implemented. In a recording DVD device, high speed write operation is demanded to write a larger volume of data in a shorter time. In this case, the semiconductor laser device is required to operate continuously with high power, and is required to have reliability under extremely large heat generation. Since the semiconductor laser device of the present embodiment is capable of operating stably for a long time even under a high temperature environment, the semiconductor laser device of the present embodiment can therefore be applied to, for example, a DVD device intended for high speed write operation. The semiconductor laser device of the present embodiment is thus very useful in the industry.

Note that, in the example described in the present embodiment, the insulating film having the impurity region is formed on the p-type cladding layer and on the side surface of the ridge waveguide of the semiconductor laser device. However, the same effects as those of the example of the semiconductor laser device can be obtained even when an insulating layer having an impurity region is provided on a p-type cladding layer in an LED. The semiconductor laser device of the present embodiment is an end-face emitting laser. However, the above insulating film having hydrogen-trapping impurities is also applicable to a surface emitting laser.

Second Embodiment

A nitride semiconductor device according to a second embodiment of the present invention will now be described with reference to the figures.

Figure 7:
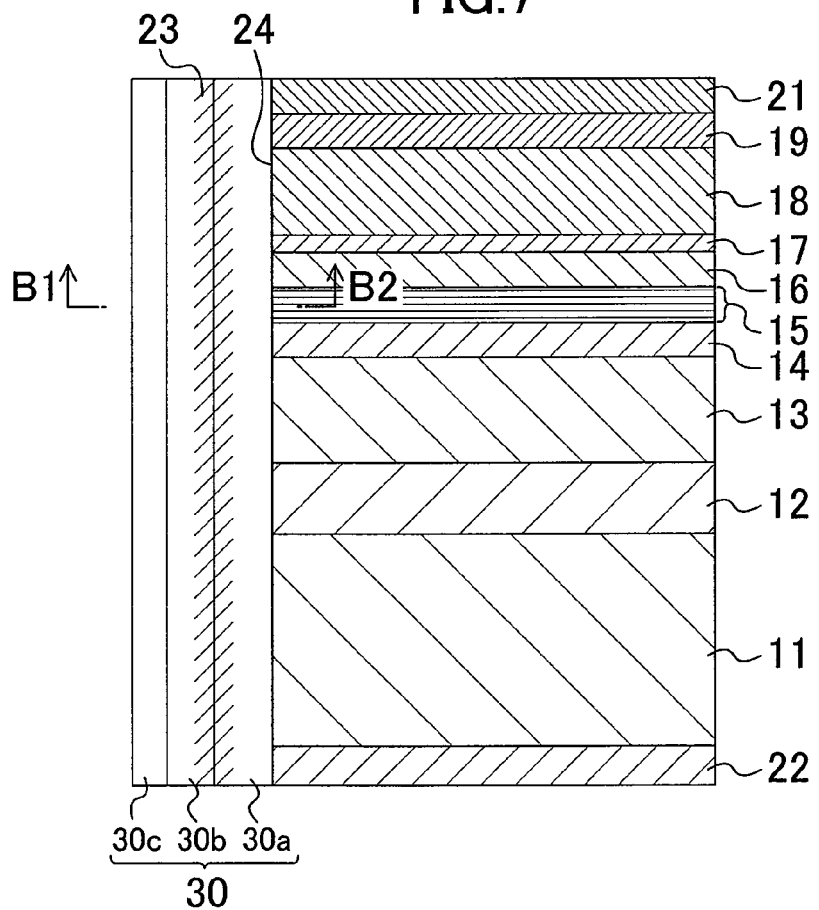
FIG. 7 is a diagram showing a cross-sectional structure of a semiconductor laser device according to a second embodiment of the present invention.

FIG. 7 shows a cross-sectional structure of the semiconductor laser device of the second embodiment. Note that FIG. 1 shows a longitudinal section vertical to the ridge waveguide (a longitudinal section vertical to the light emitting direction), while FIG. 7 shows a longitudinal section parallel to a ridge waveguide near a light emitting end on the front side of the semiconductor laser device (a longitudinal section parallel to the light emitting direction).

In the semiconductor laser device shown in FIG. 7, the structure of an n-type GaN substrate 11, an n-type GaN layer 12, an n-type cladding layer 13, an n-type optical guide layer 14, a multiple quantum well active layer 15, a p-type optical guide layer 16, an electron blocking layer 17, a p-type cladding layer 18, a contact layer 19, a p-side electrode 21, and an n-side electrode 22 is the same as that of the semiconductor laser device of the first embodiment shown in FIG. 1. The structure of a stripe-shaped ridge waveguide formed by an upper part of the p-type cladding layer 18 and the contact layer 19 and having a <1-100> zone axis is also the same as that in the semiconductor laser device of the first embodiment.

In order to protect the p-type cladding layer 18 and the contact layer 19 from contact with the outside, an insulating film (not shown) made of silicon oxide ($SiO_2$) is formed with a thickness of 400 nm so as to extend on a region lateral to the ridge waveguide on the p-type cladding region 18 and on a side surface of the ridge waveguide. In the second embodiment, no impurity region is formed in the insulating film formed on the p-type cladding layer 18. In the second embodiment, however, the same impurity region as that in the semiconductor laser device of the first embodiment may be provided in the insulating film.

The ridge waveguide is cleaved so that the cavity length is 600 μm. A mirror face 24 is formed on a (1-100) face (light-emitting end face). The mirror face 24 is formed by the respective end faces of the n-type GaN layer 12, the n-type cladding layer 13, the n-type optical guide layer 14, the multiple quantum well active layer 15, the p-type optical guide layer 16, the electron blocking layer 17, the p-type cladding layer 18, the contact layer 19, and the like.

The semiconductor laser device of the present embodiment is characterized in that an insulating film 30 having an impurity region 23 is deposited on the mirror face 24. The insulating film 30 having the impurity region 23 may be formed on at least the end face of the p-type layer such as the p-type optical guide layer 16, the electron blocking layer 17, the p-type cladding layer 18, and the contact layer 19.

The insulating layer 30 is formed by sequentially depositing a first insulating film 30a, a second insulating film 30b, and a third insulating film 30c from the side closer to the n-type GaN substrate 11 and the semiconductor layers. The first insulating film 30a has a thickness of 120 nm and is made of alumina ($Al_2O_3$). The second insulating film 30b has a thickness of 70 nm and is made of silicon oxide ($SiO_2$). The third insulating film 30c has a thickness of 40 nm and is made of zirconia ($ZrO_2$).

The impurity region 23 contains, for example, fluorine as impurities, and extends in, for example, a predetermined region in the first insulating film 30a and the second insulating film 30b from the interface between the first insulating film 30a and the second insulating film 30b in a B1-B2 section of FIG. 7. The impurity region 23 has a thickness of, for example, 50 nm.

The impurity region 23 can be formed as follows:

After the ridge waveguide is formed by the same process as that of the first embodiment shown in FIG. 2B, the first insulating film 30a made of $Al_2O_3$ is deposited with a thickness of 120 nm on the mirror face 24 by using a sputtering apparatus or the like. Fluorine is then caused to adhere to an exposed surface of the deposited first insulating film 30a by the same method as that described in the first embodiment. For example, plasma irradiation is performed for five seconds. Instead of the plasma irradiation, the impurity region 23 may alternatively be formed by using a gas such as $ClF_3$ or HF. As described in the first embodiment, impurities that are added to the impurity region 23 are not limited to fluorine. Any material capable of bonding with hydrogen can be used as the impurities.

After fluorine adheres to the exposed surface of the first insulating film, the second insulating film 30b made of $SiO_2$ and the third insulating film 30c made of $ZrO_2$ are deposited with a thickness of 70 nm and 40 nm, respectively. As in the first embodiment, in order to facilitate hydrogen trapping, it is preferable to perform heating at 150° C. or higher during or after deposition of $SiO_2$ or $ZrO_2$. Note that, as in the first embodiment, the impurity region 23 may alternatively be formed by ion implantation after deposition of the insulating film 30.

Instead of providing the impurity region 23 around the interface between the first insulating film 30a and the second insulating film 30b, the impurity region may be provided at the interface between the second insulating film 30b and the third insulating film 30c or in any of the insulating films 30a, 30b, and 30c. In the case where the insulating film 30 is formed by a plurality of films, it is preferable to provide the impurity region at the interface between the films because the number of steps for film deposition is less than the case where the impurity region is provided in each film.

Figure 8:
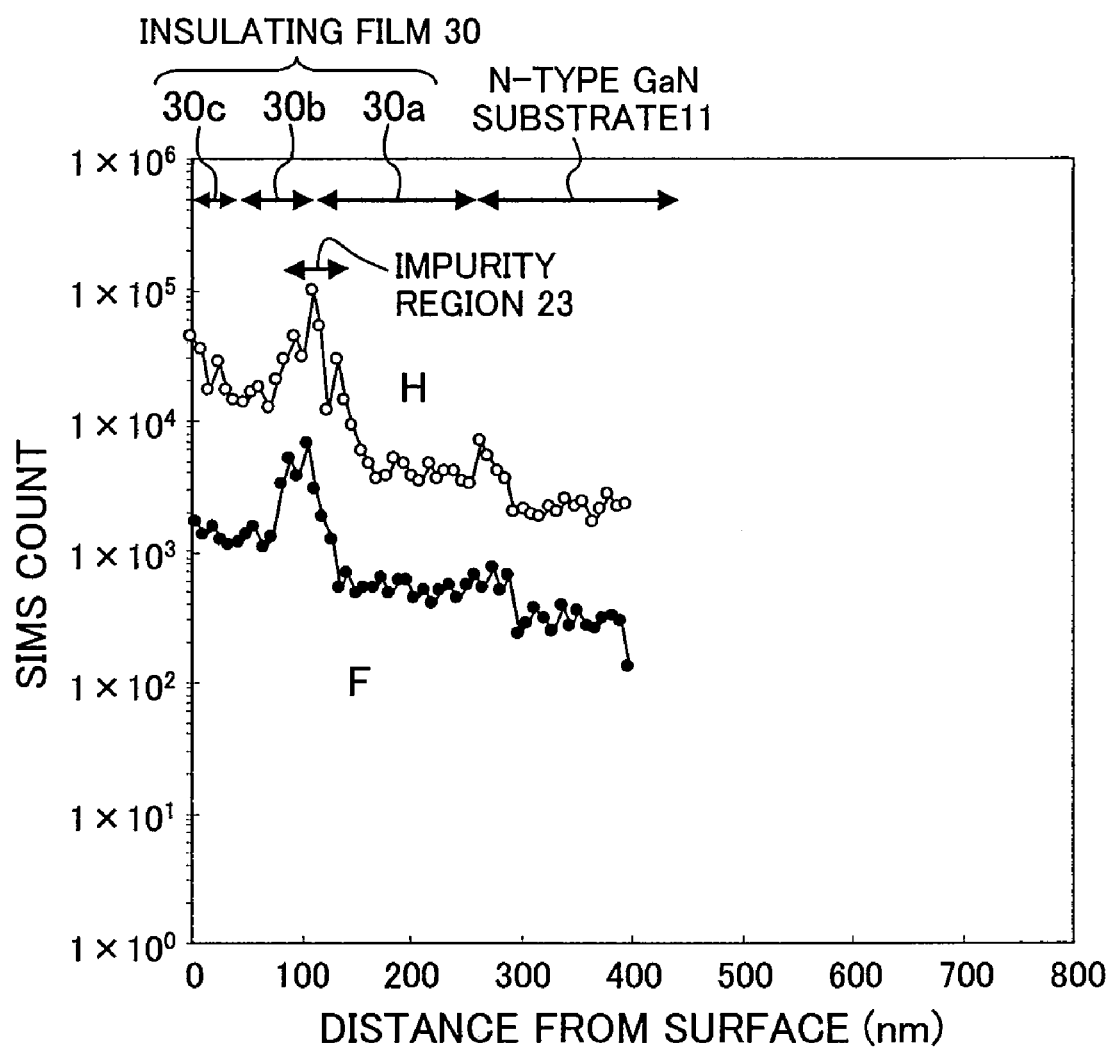
FIG. 8 is a graph showing SIMS (secondary ion mass spectrometry) depth distribution of fluorine concentration and hydrogen concentration in an impurity region along line B1-B2 of the semiconductor laser device of the second embodiment.

FIG. 8 shows SIMS depth distribution of fluorine concentration and hydrogen concentration in the impurity region 23 along line B1-B2 (see FIG. 7) of the semiconductor laser device of the second embodiment. It is actually impossible to narrow down the SIMS measurement range to about the thickness of each layer. Therefore, average hydrogen concentration values in the substrate and each layer were observed.

As shown in FIG. 8, the fluorine concentration distribution showed a peak in the impurity region 23, and the hydrogen concentration distribution also showed a peak in the impurity region 23 like the fluorine concentration distribution. It was therefore confirmed that hydrogen had been trapped in the impurity region 23.

Providing the impurity region 23 in the insulating film 30 formed on the mirror face 24 and thereby reducing the hydrogen concentration near the mirror face 24 reduces electron overflow near the mirror face 24 and thus reduces heat generation near the mirror face 24. The structure of the present embodiment is therefore effective to suppress COD.

Note that the structure on the light emitting end face of each semiconductor layer is described in the present embodiment. However, an insulating film having an impurity region may further be formed on a light emitting end face (rear end face).

Third Embodiment

A nitride semiconductor device according to a third embodiment of the present invention will now be described with reference to the figures.

Figure 9:
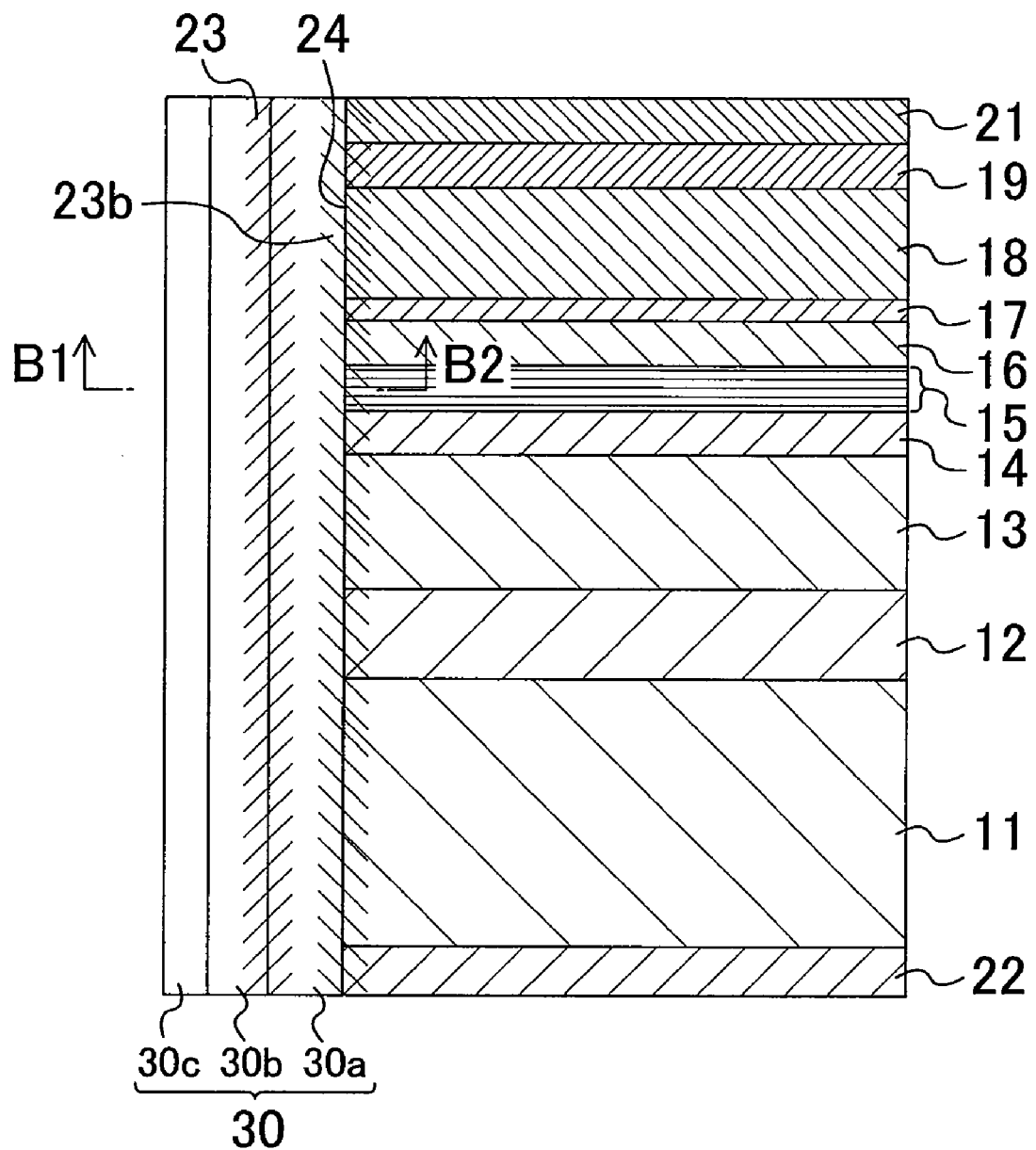
FIG. 9 is a diagram showing a cross-sectional structure of a semiconductor laser device according to a third embodiment of the present invention.

FIG. 9 shows a cross-sectional structure of a semiconductor laser device according to the third embodiment. More specifically, FIG. 9 shows a longitudinal section parallel to a ridge waveguide near a light emitting end on the front side of the semiconductor laser device (a longitudinal section parallel to the light emitting direction). The semiconductor laser device of FIG. 9 has the same structure as that of the semiconductor laser device of the second embodiment shown in FIG. 7 except for a second impurity region 23b.

The semiconductor laser device of the present embodiment is characterized in that the second impurity region 23b containing fluorine is formed near the mirror face 24 that is an interface between the insulating film 30 and each nitride semiconductor layer.

In a B1-B2 section, the second impurity region 23b is formed with a thickness of about 25 nm in the interface region between the first insulating film 30a and the second insulating film 30b. For example, this structure can be formed by the following method:

After the ridge waveguide is formed by the same process as that of the first embodiment shown in FIG. 2B, fluorine is caused to adhere to the mirror face 24 by the same method as that described in the first embodiment. For example, the plasma irradiation time is two seconds in the present embodiment. The plasma irradiation time required to form the second impurity region 23b having a thickness of 25 nm is shorter than 2.5 seconds which is a half of the plasma irradiation time for the impurity region having a thickness of 50 nm. This is because the adhesion amount of fluorine rapidly increases in the early stage of the plasma irradiation and is gradually saturated thereafter.

As in the second embodiment, a first insulating film 30a made of $Al_2O_3$ is then deposited with a thickness of 120 nm, and fluorine is caused to adhere to the surface of the deposited $Al_2O_3$ film. The plasma irradiation time is two seconds in this embodiment. Note that the time dependency of the adhesion amount of fluorine is considered to vary according to the material of the surface to which fluorine is caused to adhere. In this case, the adhesion amount of fluorine hardly changes, and approximately the same adhesion amount of fluorine as that to the mirror face 24 can be obtained by performing plasma processing for two seconds. The plasma irradiation time can thus be changed as appropriate according to the material and conditions.

Then, a second insulating film 30b made of $SiO_2$ and a third insulating film 30c made of $ZrO_2$ are deposited with a thickness of 70 nm and 40 nm, respectively. In order to facilitate hydrogen trapping, it is preferable to perform heating at 150° C. or higher during or after deposition of $SiO_2$ or $ZrO_2$.

Figure 10:
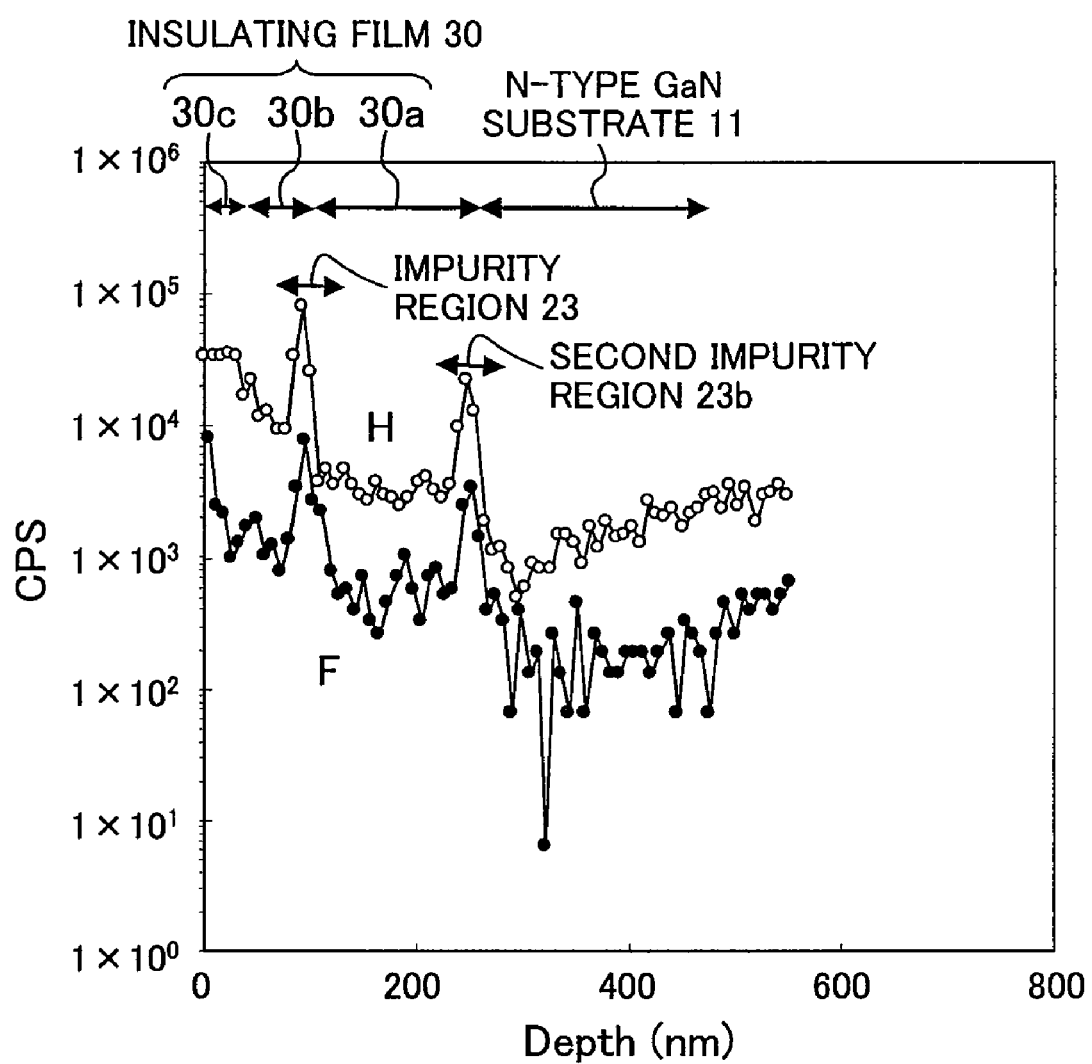
FIG. 10 is a graph showing SIMS depth distribution of fluorine concentration and hydrogen concentration in an impurity region and a second impurity region along line B1-B2 of the semiconductor laser device of the third embodiment.
Figure 11:
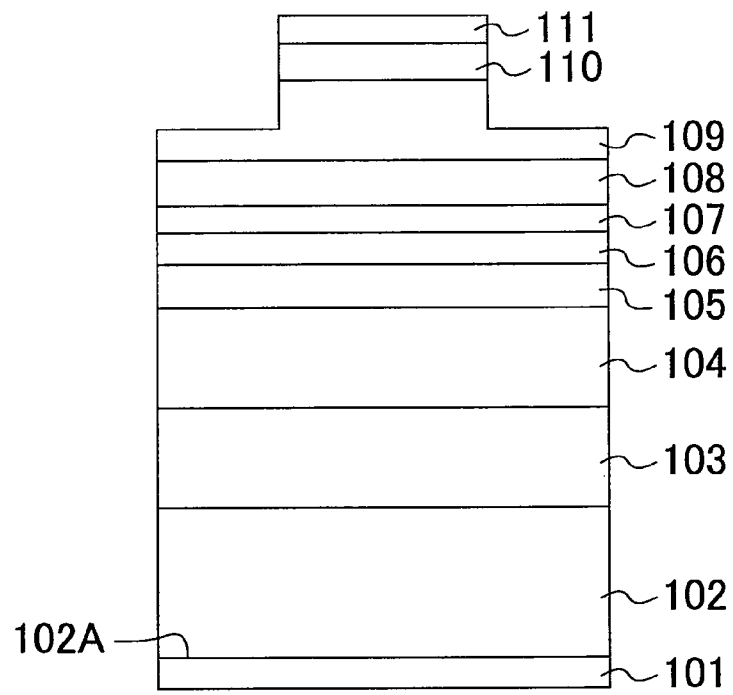
FIG. 11 is a cross-sectional view of a conventional nitride semiconductor functioning as a laser device.

FIG. 10 shows SIMS depth distribution of fluorine concentration and hydrogen concentration in the impurity region 23 and the second impurity region 23b along line B1-B2 (see FIG. 9) of the semiconductor laser device of the third embodiment. It is actually impossible to narrow down the SIMS measurement range to about the thickness of each layer. Therefore, average hydrogen concentration values in the substrate and each layer were observed.

As shown in FIG. 10, the fluorine concentration distribution showed a peak in the impurity region 23 and the second impurity region 23b, and the hydrogen concentration distribution also showed a peak in the impurity region 23 and the second impurity region 23b like the fluorine concentration distribution. It was therefore confirmed that hydrogen had been trapped in the impurity region 23 and the second impurity region 23b.

Note that, in the semiconductor laser device of the present embodiment, the hydrogen-trapping effect is obtained even when the impurity region 23 is not provided, that is, even when only the second impurity region 23b is provided. Moreover, as a method for providing an impurity region at the interface between the surface of a semiconductor and an insulating film, an impurity region can be provided at the interface between the insulating film 30 and the p-type cladding layer 18.

Note that, in the first through third embodiments, impurities such as fluorine which are added to the impurity region 23 or the second impurity region 23b preferably has a concentration of $1 \times 10^{15}$ cm$^{-3}$ to $1 \times 10^{21}$ cm$^{-3}$. If the impurity concentration is less than the order of $10^{15}$, the amount of hydrogen that can be gettered is reduced, and the effect is hardy obtained. If the impurity concentration exceeds the order of $10^{21}$, on the other hand, the number of impurity atoms per unit becomes about the same as the semiconductor concentration of the impurity region, thereby causing a structural change of the insulating film and thus affecting functions such as light confinement. It should be noted that the impurity concentration such as fluorine (F) to be added to the impurity region is not limited to the range of $1 \times 10^{15}$ cm$^{-3}$ to $1 \times 10^{21}$ cm$^{-3}$.

Note that the insulating film 20 of the first embodiment and the insulating film 30 of the second and third embodiments may be made of an oxide film such as $ZrO_2$, $HfO_2$ (hafnium oxide), $Ta_2O_5$ (tantalum oxide), $TiO_2$ (titanium oxide), and $Al_2O_3$ (aluminum oxide), a nitride film such as AlN (aluminum nitride) and GaN, an oxynitride film such as AlON (aluminum oxynitride), or a lamination film of any combination of these films. The insulating film 20 and the insulating film 30 may be a high resistance semiconductor film such as amorphous silicon.

A semiconductor laser device according to the present invention described above is useful for improvement in reliability of a device for performing read operation and/or write operation such as a DVD device.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A nitride semiconductor device, comprising:
   a semiconductor substrate;
   a p-type semiconductor layer formed over the semiconductor substrate, made of a nitride semiconductor, and containing first impurities; and an insulating film contacting the p-type semiconductor layer and having an impurity region containing second impurities for trapping hydrogen.

2. The nitride semiconductor device according to claim 1, wherein a hydrogen concentration in the impurity region is higher than a hydrogen concentration in a region other than the impurity region in the insulating film.

3. The nitride semiconductor device according to claim 1, wherein the semiconductor substrate is made of an n-type nitride semiconductor, the nitride semiconductor device further comprising:
- an n-type semiconductor layer formed on the semiconductor substrate and made of a nitride semiconductor; and
- an active layer formed on the n-type semiconductor layer and under the p-type semiconductor layer, for generating light during operation.

4. The nitride semiconductor device according to claim 3, wherein the n-type semiconductor layer has an n-type cladding layer formed under the active layer, and the p-type semiconductor layer has a p-type cladding layer formed on the active layer, the nitride semiconductor device further comprising:
- a contact layer formed on the p-type cladding layer;
- a p-side electrode formed on the contact layer; and
- an n-side electrode formed on a back surface of the semiconductor substrate.

5. The nitride semiconductor device according to claim 1, wherein the insulating film is formed at least on a top surface of the p-type semiconductor layer.

6. The nitride semiconductor device according to claim 5, wherein a stripe-shaped ridge portion is formed in an upper part of the p-type semiconductor layer, and the insulating film is formed so as to extend on a region lateral to the ridge portion of the p-type semiconductor layer and on a side surface of the ridge portion.

7. The nitride semiconductor device according to claim 1, wherein the insulating film is formed at least on an end face of the p-type semiconductor layer.

8. The nitride semiconductor device according to claim 7, wherein the impurity region is formed with a predetermined thickness in the insulating film and the p-type semiconductor layer so that at least an interface between the p-type semiconductor layer and the insulating film is located within the impurity region.

9. The nitride semiconductor device according to claim 7, wherein the insulating film is made of a plurality of insulating films, and the impurity region is formed so that at least one interface between the plurality of insulating films is located within the impurity region.

10. The nitride semiconductor device according to claim 1, wherein the second impurities have a higher bond enthalpy with hydrogen atoms than a bond enthalpy of the first impurities with the hydrogen atoms.

11. The nitride semiconductor device according to claim 1, wherein the second impurities are present in a form of fine particles in the insulating film.

12. The nitride semiconductor device according to claim 1, wherein the second impurities are fluorine.

13. The nitride semiconductor device according to claim 12, wherein the second impurities in the impurity region has a concentration of $1 \times 10^{15}$ cm$^{-3}$ to $1 \times 10^{21}$ cm$^{-3}$.

14. The nitride semiconductor device according to claim 1, wherein the first impurities and the second impurities are different materials from each other.

15. The nitride semiconductor device according to claim 1, wherein the insulating film contains one of $SiO_2$, $ZrO_2$, $HfO_2$, $Ta_2O_2$, $TiO_2$, and $Al_2O_3$ as a material.

* * * * *